United States Patent
Wang et al.

(10) Patent No.: US 11,376,703 B2
(45) Date of Patent: Jul. 5, 2022

(54) INDIUM PHOSPHIDE (INP) WAFER HAVING PITS OF OLIVE-SHAPE ON THE BACK SIDE, METHOD AND ETCHING SOLUTION FOR MANUFACTURING THE SAME

(71) Applicant: BEIJING TONGMEI XTAL TECHNOLOGY CO., LTD., Beijing (CN)

(72) Inventors: Liugang Wang, Beijing (CN); Haimiao Li, Beijing (CN); Sung-Nee George Chu, Fremont, CA (US)

(73) Assignee: BEIJING TONGMEI XTAL TECHNOLOGY CO., LTD.

( * ) Notice: Subject to any disclaimer, the term of this patent is extended or adjusted under 35 U.S.C. 154(b) by 237 days.

(21) Appl. No.: 16/641,590

(22) PCT Filed: Jun. 29, 2018

(86) PCT No.: PCT/CN2018/093619
§ 371 (c)(1),
(2) Date: Feb. 24, 2020

(87) PCT Pub. No.: WO2019/019858
PCT Pub. Date: Jan. 31, 2019

(65) Prior Publication Data
US 2021/0370459 A1    Dec. 2, 2021

(30) Foreign Application Priority Data
Jul. 25, 2017  (CN) .......................... 201710611710.1

(51) Int. Cl.
*B24B 7/22* (2006.01)
*C09K 13/00* (2006.01)
(Continued)

(52) U.S. Cl.
CPC .............. *B24B 7/228* (2013.01); *C09K 13/00* (2013.01); *C09K 13/04* (2013.01); *C30B 29/40* (2013.01);
(Continued)

(58) Field of Classification Search
CPC ........ B24B 7/228; C09K 13/00; C09K 13/04; C30B 29/40; C30B 33/10;
(Continued)

(56) References Cited

U.S. PATENT DOCUMENTS 5,899,744 A * 5/1999 Toyama ................... B28D 5/00
438/690
2002/0014681 A1 2/2002 Tsuda et al.
(Continued)

FOREIGN PATENT DOCUMENTS

| CN | 101009342 A | 8/2007 |
| CN | 102112666 A | 6/2011 |

(Continued)

OTHER PUBLICATIONS

Adachi, Chemical Etching Characteristics of (001) InP, 1981, J. Electrochem. Soc.: Solid State Science and Technology, vol. 128, No. 6, pp. 1342-1349 (Year: 1981) (Year: 1981).*

(Continued)

*Primary Examiner* — Syed I Gheyas
(74) *Attorney, Agent, or Firm* — Harness, Dickey & Pierce, P.L.C.

(57) ABSTRACT

A {100} indium phosphide (InP) wafer has multiplies of olive-shaped etch pits on the back side surface of the wafer, wherein the olive shape refers to a shape with its both ends being narrow and its middle being wide, e.g., an oval shape. A method of manufacturing the {100} indium phosphide wafer comprises: etching the wafer by immersing it into an etching solution to produce etch pits; washing the wafer with (Continued)

deionized water; protecting the back side surface of the wafer; mechanical polishing and chemical polishing the front side surface of the wafer, and then washing it with deionized water; de-protecting the back side surface of the wafer; wherein the etching solution comprises an acidic substance, deionized water and an oxidizing agent. The wafer can be heated uniformly during the epitaxial growth and thus displays good application effect.

15 Claims, 8 Drawing Sheets

(51) Int. Cl.
| | |
|---|---|
| *C09K 13/04* | (2006.01) |
| *C30B 29/40* | (2006.01) |
| *C30B 33/10* | (2006.01) |
| *H01L 21/02* | (2006.01) |
| *H01L 29/04* | (2006.01) |
| *H01L 29/20* | (2006.01) |
| *H01L 29/34* | (2006.01) |
| *H01L 31/0236* | (2006.01) |
| *H01L 31/0304* | (2006.01) |
| *H01L 31/18* | (2006.01) |

(52) U.S. Cl.
CPC ........ *C30B 33/10* (2013.01); *H01L 21/02019* (2013.01); *H01L 29/045* (2013.01); *H01L 29/20* (2013.01); *H01L 29/34* (2013.01); *H01L 31/02363* (2013.01); *H01L 31/0304* (2013.01); *H01L 31/184* (2013.01)

(58) Field of Classification Search
CPC . H01L 21/02019; H01L 29/045; H01L 29/20; H01L 29/34; H01L 31/02363; H01L 31/0304; H01L 31/184
See application file for complete search history.

(56) References Cited

U.S. PATENT DOCUMENTS

| | | |
|---|---|---|
| 2010/0224963 A1 | 9/2010 | Ishibashi et al. |
| 2011/0180805 A1 | 7/2011 | Enya et al. |
| 2014/0061694 A1 | 3/2014 | Leirer et al. |
| 2015/0361585 A1 | 12/2015 | Aigo et al. |

FOREIGN PATENT DOCUMENTS

| | | |
|---|---|---|
| CN | 102796526 A | 11/2012 |
| CN | 102931244 A | 2/2013 |
| CN | 103403839 A | 11/2013 |
| CN | 103487453 A | 1/2014 |
| CN | 104900492 A | 9/2015 |
| CN | 104981892 A | 10/2015 |
| CN | 205282486 U | 6/2016 |
| JP | 2014112695 A | 6/2014 |
| WO | 00/59026 A1 | 10/2000 |
| WO | 2011/007776 A1 | 1/2011 |
| WO | 2012/075461 A1 | 6/2012 |

OTHER PUBLICATIONS

Kambayash T et al: "Chemical Etching of InP and GAINASP for Fabricated Laser Diodes and Integrated Optical Circuits", Japanese Journal of Applied Physics, Japan Society of Applied Physics, JP, vol. 19, No. 1, Jan. 1, 1980, p. 79-85, XP000817783.
Adachi S: "Chemical Etching of InP and INGAASP/InP", Journal of the Electrochemical Society, vol. 129, No. 3, Mar. 1, 1982, p. 609-613, XP000840504.

* cited by examiner

INDIUM PHOSPHIDE (INP) WAFER HAVING PITS OF OLIVE-SHAPE ON THE BACK SIDE, METHOD AND ETCHING SOLUTION FOR MANUFACTURING THE SAME

TECHNICAL FIELD

The present invention relates to a {100} indium phosphide (InP) wafer having pits of olive-shape on the wafer backside surface, to a method and etching solutions for manufacturing the same.

BACKGROUND ART

Indium phosphide (InP) single crystal belongs to a group of III-V compound semiconductor material with a forbidden energy band gap of 1.35 eV. Indium phosphide (InP) has superior properties such as high electron mobility, good radiation resistance, and high thermal conductivity. Thus, it has been widely used as a main substrate for optoelectronic devices in many fields such as fiber-optic communications, microwave and millimeter wave devices and radiation-resistant solar cells. At present, majority of the monocrystalline indium phosphide (InP) substrates available as commercial products are {100} oriented indium phosphidewafers.

The performance and service life of an indium phosphide device depend mainly on the structure of the device itself and the epitaxial functional layers grown thereon. To form an epitaxial layer structure with good quality on a substrate, it is crucial to control the substrate front surface temperature during epitaxial growth. However, the actual temperature of the front surface is strongly affected by the emissivity of the substrate backside surface that is determined by the surface roughness and morphology. Therefore a high quality substrate not only requires to have a good crystalline quality of the bulk substrate material, the roughness and morphology of the substrate back surface are required to be uniform and controllable to match the epitaxial growth condition. Wafer lapping and etching are crucial steps for manufacturing wafers with a controllable surface roughness and surface morphology.

Chinese Patent Publication No. CN102796526A discloses etching solutions and a method for etching monocrystalline indium phosphide wafers.

Hitherto there is no relevant report about producing a controllable surface roughness and surface morphological features of indium phosphide (InP) wafers. Most of the prior art on {100} oriented indium phosphide wafers has been focused on the front wafer surface cleanliness for epitaxial layer growth

SUMMARY OF THE INVENTION

The objective of the present invention is to provide a {100}indium phosphide wafer having pits of olive-shape on the back side, and also to provide a method for manufacturing the {100} indium phosphide wafer and etching solutions for manufacturing the same.

The present invention is fulfilled by the following technical solutions:

The first aspect of the present invention relates to a {100} indium phosphide (InP) wafer having pits of olive-shape on the backside surface, and wherein the olive shape on the backside surface have a shape with its both ends being narrow and its middle being wide, e.g., an oval shape.

The second aspect of the present invention relates to a method for manufacturing the {100} indium phosphide (InP) wafer according to the first aspect of the invention which mentioned in the following scheme:

Scheme
subjecting the {100} indium phosphide (InP) wafer to surface lapping on both sides;
etching the {100} indium phosphide (InP) wafer by immersing it in to an etching solution;
removing the {100} indium phosphide wafer that has been etched and washing it with deionized water;
protecting the back side surface of {100} indium phosphide (InP) wafer that has been etched;
subjecting the front surface of {100} indium phosphide (InP) wafer which has the back side surface been protected and has been etched to mechanical polishing and chemical polishing, and then washing it with deionized water;
de-protecting the back side of the {100} indium phosphide (InP) wafer;
wherein the etching solutions comprising of an acidic substance, deionized water and an oxidizing agent; the acidic substance, deionized water and oxidizing agent present in the etching solutions in ratios of 1:(0.02-0.6):(1.5-6), preferably 1:(0.03-0.5):(2.5-5), based on mole ratio; the etching temperature has a range of from 15 to 95° C., preferably from 18 to 50° C., and more preferably from 20 to 40° C.; and the etching times are from 10 to 600 s, preferably from 30 to 500 s, and more preferably from 50 to 450 s.

Compared with the prior art, the present invention has the following advantages:

(1) To provide {100}indium phosphide (InP) wafers with a controllable emissivity of wafer backside surface in epitaxial growth to control wafer front surface temperature;

(2) To provide a uniformly distributed backside surface roughness and pit of olive-shape morphology and hence uniform emissivity for uniform absorption of thermal radiation. A uniform front surface temperature distribution benefits the growth of the epitaxial layer for both material quality and uniformity across the wafer;

(3) The method for manufacturing the {100} indium phosphide (InP) wafer according to the present invention is simple to operate and easy to manufacture indium phosphide (InP) wafer having controllable surface morphology and good reproducibility.

DESCRIPTION OF THE FIGURES

In FIG. 4, FIGS. 4a and 4b are each a cross-sectional view of the {100} indium phosphide (InP) wafer after having been cut and subjected to chamfering.

In FIG. 5.

MODE FOR CARRYING OUT THE INVENTION

Figure 1A:
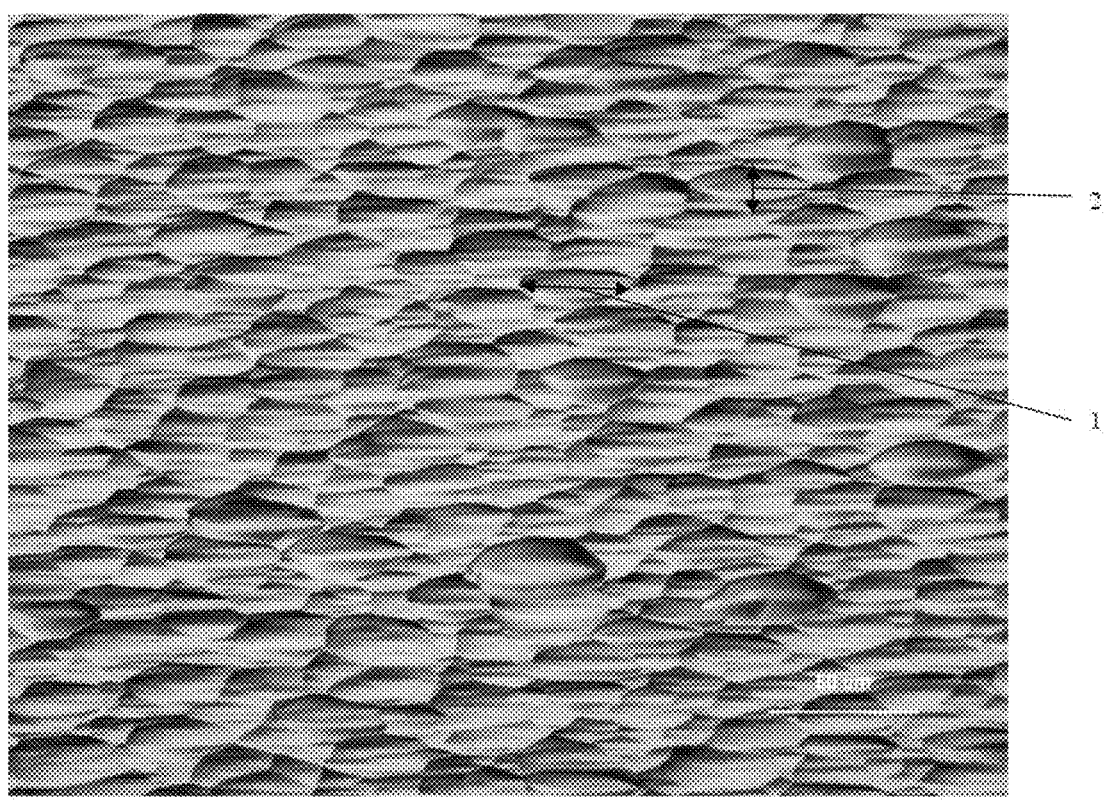
FIG. 1a is an image of the back side surface of {100} indium phosphide (InP) wafer obtained in Example 1 of the present invention observed by optical microscope at 500-fold magnification, showing regular morphology of the pits of olive-shape, wherein 1 represents long axis substantially parallel to the direction of [011]orientation; and 2 represents short axis substantially parallel to [0-11]orientation.

In the present invention, all operations are carried out at room temperature except etching and under normal pressure unless otherwise specified.

In the present invention, the {100} indium phosphide (InP) wafer having pits of olive-shape on the back side surface has a diameter of 2 to 15 cm (preferably 5 to 12 cm) and a thickness of 250 to 850 μm.

In the present invention, the diameter of the wafer should be understood as follows: if the wafer is circular, the diameter refers to the diameter of the circle; if the wafer is in other shapes (such as an irregular circle, a square or a rectangle), it refers to the diameter of a circle that is centered at the wafer center and includes all portions of the wafer. The surfaces of the wafer refer to ones that have the largest area and are opposite with each other. The back side surface of the wafer refers to the surface distributed with pits, this surface has not been or would not be subjected to polishing treatment; in contrast, the front side is the surface that has been or will be subjected to mechanical polishing and chemical polishing.

In the present invention, the pits distributed on the back side surface of the {100}indium phosphide wafer results in surface roughness on the back side.

According to the actual applications of the wafer, persons of ordinary skills in the art can understand that a {100}indium phosphide wafer having pits of olive-shape on the back side surface refers to a {100} indium phosphide wafer having pits of olive-shape on at least one side surface, pits of olive-shape may exist on the other side surface, but have to be finally removed by mechanical and/or chemical polishing. In other words, The finally obtained wafer product—the most preferred product—is a wafer having pits on one side surface and is smooth on the other side surface, and particularly is a wafer having pits on one side surface and is smooth on the other side surface owing to mechanical polishing and chemical polishing (this side may be directly used for epitaxial growth). The present invention also includes wafers having pits on both side surfaces; nevertheless, they need to be subjected to further polishing treatment.

During the epitaxial growth, the temperature on the wafer surface directly affects the chemical composition and quality of the epitaxial layer. The temperature on the wafer surface depends on the thermal energy absorbed and transferred during the heating in the epitaxial reactor; the pits on the back side surface of the wafer increases surface area and thus facilitate thermal adsorption and dissipation of the wafer. The thermal energy in the epitaxial reactor is absorbed and transferred mainly in three manners: 1) heat transfer by direct contact, 2) heat transfer by hot gas flow, and 3) absorption of thermal radiation. The absorption of thermal radiation is affected by the roughness (mainly caused by pits), reflectance and etched morphology on the back side surface of the wafer; and the absorption of thermal radiation in turn affects the quality of the epitaxial layer. Growth of different epitaxial device structures has different temperature requirements, hence different roughness, reflectance and etched morphology of the back side surface of the wafer. A tough issue is to prepare a wafer with suitable roughness of back side surface and etching morphology that matches well with the epitaxial growth condition.

In the present specification, for conciseness, the same contents applicable to the three aspects of the present invention (indium phosphide wafer having pits on the back side surface, method and etching solutions for manufacturing the same) are not repeated. It should be appreciated, however, that the illustrations on one aspect of the present invention also apply to the other two aspects of the present invention.

The object of the present invention is fulfilled by the following technical solutions:

The first aspect of the present invention relates to a {100} indium phosphide (InP) wafer having pits of olive-shape on the back side surface, and wherein the olive shape refers to a shape with its both ends being narrow and its middle being wide, e.g., an oval shape.

Preferably, the pits of olive-shape are regularly distributed on the surface of the {100} indium phosphide (InP) wafer. Since the {100} indium phosphide (InP) wafer is a single crystal, its surface is uniformly flat. In case that the {100} indium phosphide (InP) wafer is treated with an etching solution, uniformly and regularly distributed pits of olive-shape can be obtained. In the present invention, the pits of olive-shape means that on the surface of the {100} indium phosphide (InP) wafer, the pits of olive-shape have oval shapes with included angles (acute angles) between long axes being not more than 10°, preferably not more than 6°, and the said olive shape pits are "regularly distributed".

The wafers, depending on the processing stages that they are subjected to, may have pits of olive-shape on one side or on both side surfaces. Wafers having pits of olive-shape on both side surfaces are obtained, for example, by being etched with an etching solution after having been cut from the ingot and been subjected to surface lapping on both sides.

Wafers having pits of olive-shape on single side surface are obtained, for example, by the following steps: after producing pits on both side surfaces of the wafer, protecting one side surface of the wafer with a protective layer and subjecting the unprotected side to mechanical polishing and/or chemical polishing so as to finally give a wafer with pit on one side surface. Wafers having pits on single side surface may also obtained, for example, by the following steps: a wafer cutting from the ingot, subjected to surface lapping on both side, and then protecting one sides of the wafers with a protective layer, etching the wafers by immersing into an etching solution, thereby obtaining wafers having pits of olive-shape on one side surface; protecting the surface with pits of thus obtained wafers with a protective layer, then de-protecting the one side that has been previously protected with a protective layer, subjecting the sides without pits to mechanical polishing and/or chemical polishing, the finally obtained wafers have pits of olive-shape on one side.

Preferably, the pits of olive-shape have an average long-axis length (the longest length in the length direction of the olive shape) of 3 to 50 μm, and an average short-axis length (the largest dimension perpendicular to the long-axis direction of the olive shape) of 1 to 30 μm.

In a preferred embodiment of the present invention, the side of the wafer on which the pits of olive-shape are distributed has a surface roughness Ra in the range of 0.2 to 1.5 μm.

In the present invention, the depth of pits on the back side surface refers to a distance extending perpendicularly downwards from the back side surface plane to the bottom of the pits; wherein the maximum depth of the backside pit is the maximum value of all the measured depths of the pit. In the present invention, the depth of the pits is used to characterize the degree to which the surface of the single crystal is etched with the etching solution.

In a preferred embodiment of the present invention, the pits on the back side surface have a maximum depth of 5.0 μm, and the percentage of the pits of olive-shape having a depth of more than 2.0 μm is not less than 30%.

In another preferred embodiment of the present invention, the pits on the back side surface have a maximum depth of 3.5 μm, and the percentage of the pits of olive-shape having a depth of more than 1.5 μm is not less than 20%.

In another preferred embodiment of the present invention, the pits on the back side surface have a maximum depth of 3.5 μm, and the percentage of the pits of olive-shape having a depth of more than 2.0 μm is not less than 30%.

The second aspect of the present invention relates to a method for manufacturing the {100} indium phosphide (InP) wafer according to the first aspect of the invention, which mentioned in the following scheme:

Scheme
  subjecting the {100} indium phosphide (InP) wafer to surface lapping on both sides;
  etching the {100} indium phosphide (InP) wafer by immersing it into an etching solution to produce etch pits;
  removing the {100} indium phosphide wafer that has been etched and washing it with deionized water;
  protecting the back side surface of {100} indium phosphide (InP) wafer that has been etched;
  subjecting the {100} indium phosphide (InP) wafer which has the back side surface been protected and has been etched to mechanical polishing and chemical polishing, and then washing it with deionized water;
  de-protecting the back side surface of the {100} indium phosphide (InP) wafer;

wherein the etching solutions comprise of an acidic substance, deionized water and an oxidizing agent; the acidic substance, deionized water and oxidizing agent present in the etching solutions in ratios of 1:(0.02-0.6):(1.5-6), preferably 1:(0.03-0.5):(2.5-5), based on mole ratio; the etching temperature has a range from 15 to 95° C., preferably from 18 to 50° C., and more preferably from 20 to 40° C.; and the etching times is from 10 s to 600 s, preferably from 30 to 500 s, and more preferably from 50 to 450 s.

The etching of the present invention can be carried out in one step or in multiple steps. Preferably, in etching, the {100} indium phosphide (InP) wafer may be fixed on a clamping tool; further preferably, the clamping tool is constantly shaken during etching to allow the etching to proceed more rapidly and uniformly.

After the etching is finished, the wafer is washed with deionized water quickly so as to remove the etching solution remaining on the etched {100} indium phosphide wafer surface to prevent from excess etching.

In the manufacturing method of the present invention, the {100} indium phosphide (InP) wafers used are cut from indium phosphide ingots having diameters range from 2 to 15 cm grown by Vertical Gradient Freeze (VGF), but are not limited to VGF ingot.

In a preferred embodiment of the present invention, the indium phosphide ingot is a monocrystalline indium phosphide ingot.

In a preferred embodiment of the present invention, the indium phosphide ingot is one having a circular transverse cross-section (referred to as a circular indium phosphide ingot) and a longitudinal cross-section in a rectangular or square shape. The circular cross-section generally has a diameter of 2 to 15 cm, preferably 5 to 12 cm.

Of course, the indium phosphide ingot may be one having a transverse cross-section of other shapes, for example, an ingot having a transverse cross-section of special shapes (oval, square, rectangle, etc.) obtained by processing a circular ingot. On such occasions, the wafer obtained after cutting step is a special-shaped wafer.

The wafer cutting is typically carried out using outer-circle cutting machines, inner-circle cutting machines or multi-wire cutting machines that have been known in the art. Multi-wire cutting machines are preferred owing to their good productivity and wafer yield. In general, the wafer obtained after the cutting has a thickness of not more than 850 μm. For example, the cut wafer has a thickness of 250 to 850 μm, more preferably 270 to 820 μm, and more preferably 300 to 800 μm.

After wafer cutting, the {100} indium phosphide (InP) wafer will be subjected to surface lapping. The surface lapping intends to eliminate part of surface damage formed during wafer cutting, lowering the surface roughness, and smoothing the {100} indium phosphide (InP) substrate. The surface lapping operation can be carried out using lapping machine known from the prior art under known lapping conditions. For example, the lapping powder is used in the lapping process; preferably it has a median particle size of 2 to 17 μm, preferably 3 to 15 μm, and even preferably 4 to 12 μm.

Preferably, after the wafer cutting step and before the surface lapping step, the cut wafer is subjected to edge-chamfering treatment to form wafer edges with suitable circular arc. Preferably, the cross-section of the wafer edge is arc-shaped. Preferably, the semiconductor wafers, being subjected to this treatment step, have lower wafer edge damage and lower wafer breakage rate in the subsequent steps. The chamfering treatment is usually performed using a chamfering machine. Any chamfering machine known from the prior art can be used in this step. It is understood that if the wafer is of a special-shape, the entire periphery or parts of the special-shaped wafer is subjected to chamfering treatment in this step; however, it may also understood that only parts of the wafer edge will subject to chamfering treatment for the special-shaped wafer.

The step of wafer etching with an etching solution according to the present invention may be performed after the wafer cutting and the surface lapping steps, followed with optional chamfering step; alternatively, the step of wafer etching may also be performed after the cutting, chamfering and surface lapping steps. It is also possible to perform wafer etching with an etching solution after the mechanical polishing and chemical polishing described below: the side of wafer surface on which pits are desired to be formed is not protected with a protective layer, whereas the other side on which the pits are not desired (i.e., the surface being kept in the polished state) is protected with a protective layer. Nevertheless, it is preferred that the mechanical polishing and chemical polishing are performed after the etching treatment with the etching solution, in which the surface on which pits are desired to be formed is protected with a protective layer to prevent it from being polished.

In the present invention, the protective layer should be understood in a broad sense, including conventional plastic protective layers such as plastic sheets, metal sheet, glass sheet, or ceramic sheets. The protective layer can be fixed to the wafer with, for example, beeswax or arabic gum. The protective layer, after mild heating, can be easily detached (i.e., de-protected).

The wafer of the present invention has surface typically rough polished and then finish polished to give a wafer product that can be directly used for epitaxial growth.

The purpose of polishing is to eliminate part of the damage layer caused in the previous processing step, to lower the surface roughness, and to smooth the substrate surface. Rough polishing and finish polishing are performed using known polishing machines under known polishing conditions. For example, polishing agents or powder such as INSEC IPP or Fujimi COMPOL 80 (available from Fujimi Corporation, Japan) can be used.

Since rough polishing and finish polishing per se can be carried out using known methods in the prior art, they are not described in detail here (detailed illustrations may be found in the Chinese Patent Publication No. CN 104900492A).

Having been subjected to rough polishing and finish polishing, the polished surface of the wafer has a surface roughness of not more than 0.5 nm. The wafer has a preferable thickness of 250 to 850 μm, for example 280 to 750 μm; it has a surface roughness of 0.20 to 0.50 nm, preferably 0.20-0.40 nm, and more preferably 0.20-0.35 nm; and generally the wafer has a diameter of 2 to 15 cm, preferably 5-12 cm.

Preferably, the resulting wafer has a flatness of 3 to 7 μm and preferably 3 to 5 μm.

Optionally, following the final step of the preceding methods, the wafer is further subjected to surface cleaning treatment (including necessary drying), preferably wet surface cleaning treatment. The cleaning treatment process is not particularly limited and can be conducted by any methods known in the prior art as long as it can achieve the desired cleanness of the wafer surface. Preferably, the wet surface cleaning treatment is carried out in a clean room rated as Class 1000 or greater. The clean room rating is defined in USA Federal Standard 209D clean room specifications (see Table 1 below). In this case, only the number of dust particles is usually considered. For example, a class 1,000 clean room generally means that the number of particles ≥0.5 μm is ≤1000 per cubic foot; and the number of particles ≥5.0 μm is ≤10 per cubic foot. Preferably, after the surface cleaning treatment in step (5), the surface of the wafer is ascertained to be free of particles and white haze by visual inspection under light irradiation. And the residual amounts of metals Zn and Cu on the surface of the wafer are each ≤10×10$^{10}$ atoms/cm$^2$. In this way, the semiconductor wafer produced by the method of the present invention does not need any further pre-epitaxial treatment and is ready-to-use. Since the prior art methods can be adopted for cleaning, they are not described in detail here.

TABLE 1

USA Federal Standard 209D cleanroom specifications

| Clean room class | Dust particle | | Pressure mmAg | Temperature | | | | | | Air velocity and ventilation | | Illumination |
| | Particle size (μm) | Particle Number (Particles/ft 3) | | Value range ° C. | Recommended value ° C. | Error value ° C. | Max % | Min % | Error % | rate (time/hr) | | |
|---|---|---|---|---|---|---|---|---|---|---|---|---|
| 1 | ≥0.5 | ≤1 | >1.3 | 19.4~25 | 22.2 | ±2.8 Special need ±1.4 | 45 | 30 | ±10 Special need ±5 | Laminar flow 0.35~0.55 m/s | | 1080~1620 |
|   | ≥5.0 | 0 | | | | | | | | | | |
| 10 | ≥0.5 | ≤10 | | | | | | | | | | |
|   | ≥5.0 | 0 | | | | | | | | | | |
| 100 | ≥0.5 | ≤100 | | | | | | | | | | |
|   | ≥5.0 | ≤1 | | | | | | | | | | |

TABLE 1-continued

USA Federal Standard 209D cleanroom specifications

| Clean room class | Dust particle | | Pressure mmAg | Temperature | | | | | | Air velocity and ventilation rate (time/hr) | Illumination |
| | Particle size (μm) | Particle Number (Particles/ft 3) | | Value range ° C. | Recommended value ° C. | Error value ° C. | Max % | Min % | Error % | | |
|---|---|---|---|---|---|---|---|---|---|---|---|
| 1000 | ≥0.5 | ≤1000 | | | | | | | | Turbulent flow ≥20 times/hr | |
| | ≥5.0 | ≤10 | | | | | | | | | |
| 10000 | ≥0.5 | ≤10000 | | | | | | | | | |
| | ≥5.0 | ≤65 | | | | | | | | | |
| 100000 | ≥0.5 | ≤100000 | | | | | | | | | |
| | ≥5.0 | ≤700 | | | | | | | | | |

Surface cleaning treatment does not change the physical state of the wafer surface.

The surface-cleaned wafers can be directly used for epitaxial growth.

The third aspect of the present invention relates to an etching solution for manufacturing the {100} indium phosphide (InP) wafer according to the first aspect of the invention, comprising an acidic substance, deionized water and an oxidizing agent; the acidic substance, deionized water and oxidizing agent present in the etching solution are in ratios of 1:(0.02-0.6):(1.5-6), based on mole ratio; preferably the oxidizing agent should be present in amole range of 0.02 to 0.6.

In a preferred embodiment of the invention, the acidic substance is an inorganic acid, including but not limited to sulfuric acid, phosphoric acid, hydro-bromic acid, hydrochloric acid, and nitric acid; or an organic acid, including but not limited to acetic acid, propionic acid, and butyric acid; or a mixture thereof, preferably a mixture of sulfuric acid and hydrochloric acid, or preferably a mixture of acetic acid and hydrochloric acid.

In a preferred embodiment of the invention, the oxidizing agent is $H_2O_2$, or a high-valent water-soluble compound containing Cr or Mn. The high-valent water-soluble compounds containing Cr or Mn are, for example, $KMnO_4$, $K_2Cr_2O_7$ and the like.

The individual chemical components are mixed to yield the etching solutions of the present invention. It is preferred that the etching solution is used immediately after having been formulated.

For a better understanding of the present invention, the present invention will be described in detail with reference to the examples below, but it should be understood that the examples are merely illustrative for the present invention and are not intended to limit the present invention. In the context of the present invention, the general definitions and the preferred definitions at each level may be combined with one another to form a new technical solution, which is also considered to be disclosed by the present specification.

EXAMPLES

In each examples, the lapping, rough polishing and finish polishing, wafer protection and cleaning processes are not described in detail because they can be performed by known methods in the prior art (detailed illustrations may refer to the Chinese Patent Publication No. CN 104900492A, especially the conditions as specified under the first group in Example 1).

Unless otherwise specified, the conditions under which the prepared wafer is measured are as follows (the wafer surface to be measured is a surface facing upwards in the polishing machine):

1. The residual amount of trace metal atoms on the surface of the wafer having undergone wet cleaning treatment is measured with TXRF (Total Reflection X-Ray Fluorescence Spectrometer; TREX610, available from Technos Co., Ltd., OSAKA, Japan). Acceptance standard: the residual amounts of Zn and Cu each $\leq 10\times 10^{10}$ atoms/cm$^2$;
2. Roughness Measurement
2.1 For the back surface of the {100} indium phosphide (InP) wafer on which pits of olive-shape are distributed ("back side"), the surface roughness Ra expressed in micrometers (μm) is measured with a surface profiler where Ra is not more than 1.5 μm.
2.2 For the front surface of the wafer for epitaxial growth that has undergone rough polishing and finish polishing ("front side"), the surface roughness Ra is measured with AFM (Atomic Force Microscopy) (vertical resolution: 0.03 nm, analyzed area: 5 μm×5 μm); Ra is expressed in nanometer (nm). The surface roughness of the polished surface of not more than 0.5 nm is regarded as acceptable.
3. The wafer thickness is measured with Contact Thickness Gauge (Model No.: ID-C112ED, manufactured by MITUTOYO Corporation, Japan).
4. The depths of the pits on the back side of the wafer were measured with surface profiler (SV-600, manufactured by MITUTOYO Corporation, Japan).

In the case of multiple wafers, the numerical values refer to average values.

Example 1

An etching solution comprising sulfuric acid, $H_2O_2$ and deionized water in a molar ratio of 1:0.57:5.58 was formulated by the steps of first mixing deionized water with $H_2O_2$, and then adding sulfuric acid therein while stirring.

Figure 1B:
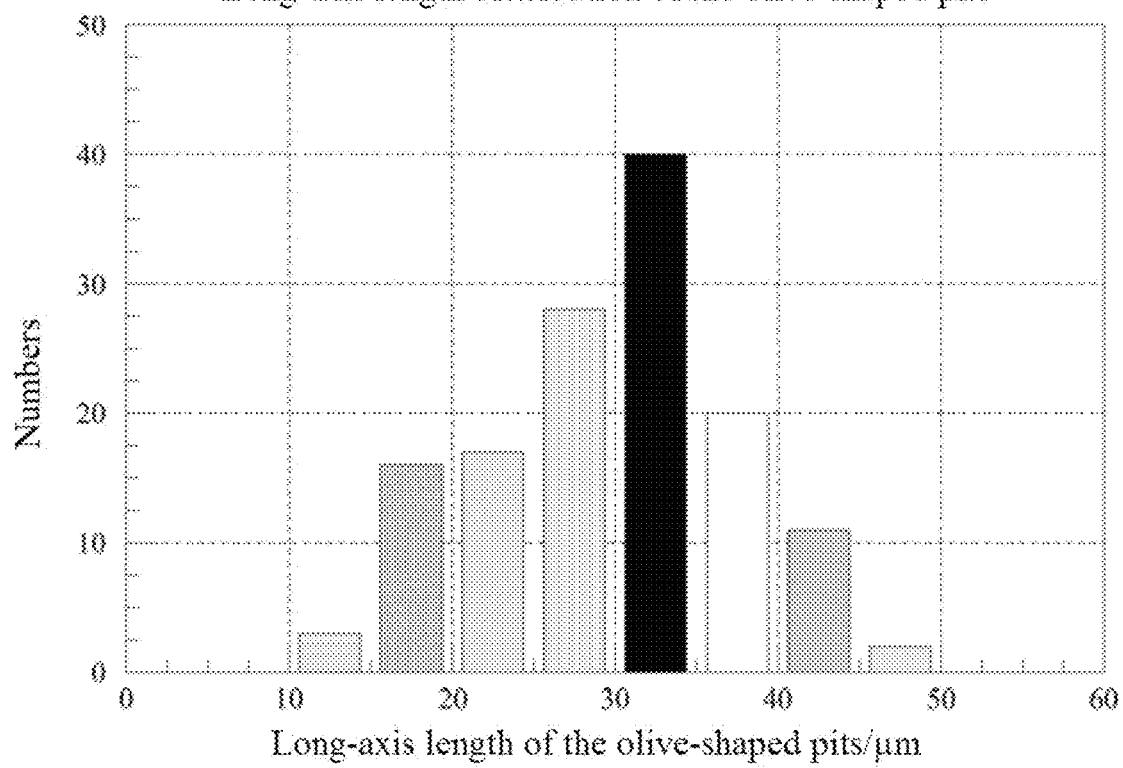
FIG. 1b illustrates a histogram of the long-axis length distribution of the pits of olive-shape on the back side surface of the {100} indium phosphide (InP) wafer obtained in Example 1 of the present invention.
Figure 1C:
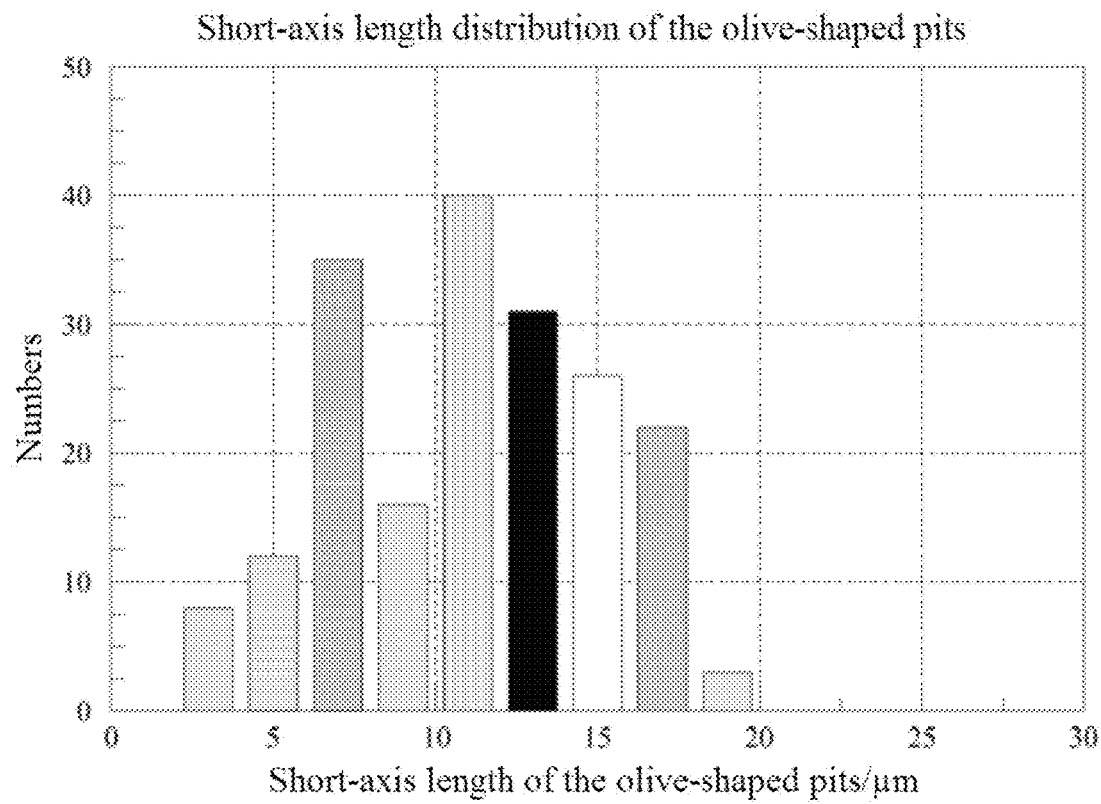
FIG. 1c illustrates a histogram of the short-axis length distribution of the pits of olive-shape on the back side surface of the {100} indium phosphide (InP) wafer obtained in Example 1 of the present invention.
Figure 1D:
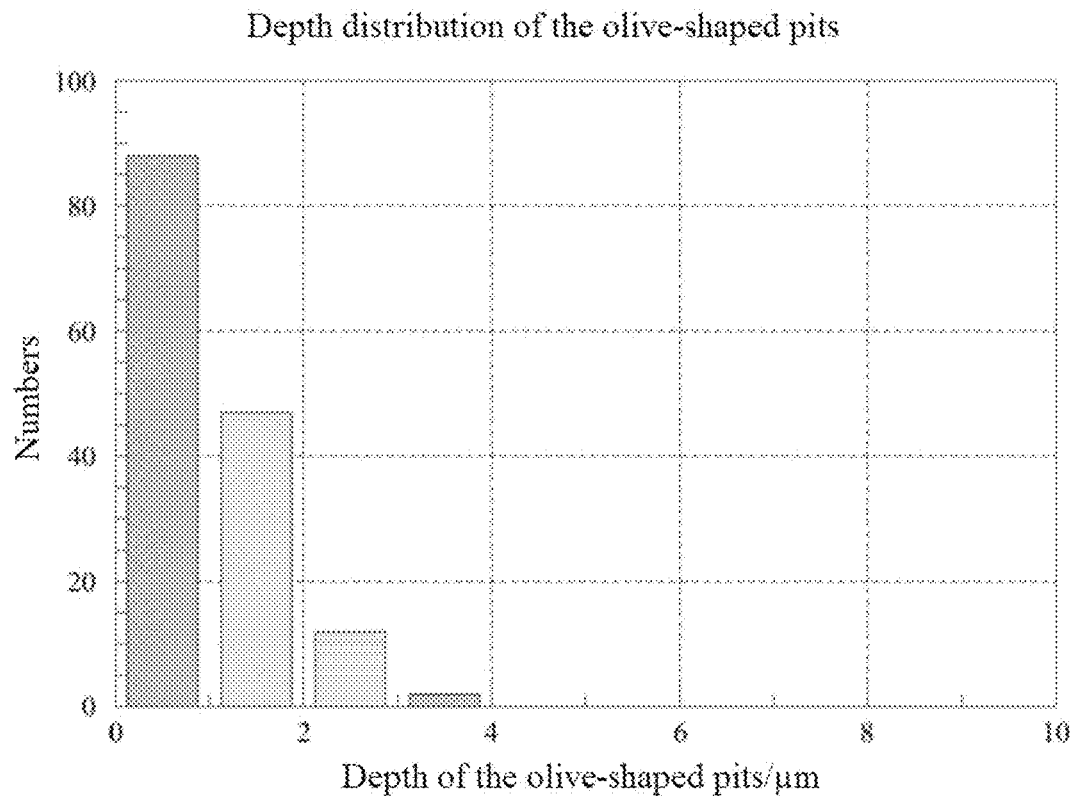
FIG. 1d illustrates a histogram of depth distribution of the pits of olive-shape on the back side surface of the {100} indium phosphide (InP) wafer obtained in Example 1 of the present invention.
Figure 4A:
Figure 4B:

A {100} indium phosphide (InP) wafer was manufactured by a method comprising the following steps, wherein the above etching solution is used:

(1) Cutting a {100} indium phosphide indium (InP) wafer from an indium phosphide ingot having a diameter of 10 cm with a multi-wire cutting machine, wherein the indium phosphide ingot is a monocrystalline indium phosphide ingot having a circular transverse cross-section (referred to as circular indium phosphide (InP) ingot) and a rectangular longitudinal cross-section, the circular transverse cross-section has a diameter of 10 cm;

(1') Subjecting the cut wafer in the step (1) to edge-chamfering treatment using a chamfering machine to produce an arc-shaped edges (FIG. 4a);

(1") Subjecting both sides of the {100} indium phosphide (InP) wafer to surface lapping, the lapping compound used for surface lapping is commercially available alumina powder having a median particle size of 4 to 6 μm;

(2) Immersing the {100} indium phosphide (InP) wafer into the above mentioned etching solution at 60° C. for 480 s;

(3) Removing the etched {100} indium phosphide (InP) wafer and washing it with deionized water;

(4) Protecting the back side of the {100} indium phosphide (InP) wafer;

(5) Subjecting the etched {100} indium phosphide (InP) wafer that has back side surface been protected to mechanical polishing and chemical polishing of the front side surface and then washing it with deionized water;

(6) De-protecting the back side of the {100} indium phosphide (InP) wafer to give a {100} indium phosphide (InP) wafer having pits of olive-shape distributed on the back side, further, washing and drying the wafer, and then observing the surface morphology thereof with optical microscope (BX53, available from OLYMPUS Corporation) (observation position being the center of the circular wafer). FIG. 1a shows the surface morphology of the wafer (number "1" marked therein refers to the long axis and "2" refers to the short axis), wherein the long axis is parallel to [011] and the short axis is parallel to [0-11] (the included angles between long axes or between short axes are less) than 5°. FIG. 1b shows the histogram of the long-axis length distribution of the pits of olive-shape on the back side of the resulting {100} indium phosphide (InP) wafer; and FIG. 1c shows the histogram of the short-axis length distribution.

The resulting wafer has a thickness of 300 μm and a back side surface roughness Ra of 0.5 μm. The pits of olive-shape have a long-axis length of 15 to 45 μm and an average short-axis length of 10 to 20 μm. The pits of olive-shape on the back side surface of the resulting wafer have a maximum depth of 3.5 μm, and the percentage of the pits of olive-shape having a depth of more than 1.5 μm is 20%.

The wafers as measured under the above items 1, 2.2 and 3 are acceptable.

Example 2

An etching solution comprising acetic acid, deionized water and potassium permanganate solution was formulated. Based on mole ratio, $CH_3COOH$, $KMnO_4$ and deionized water present in the etching solution are in a ratio of 1:0.35:4.53.

Figure 2A:
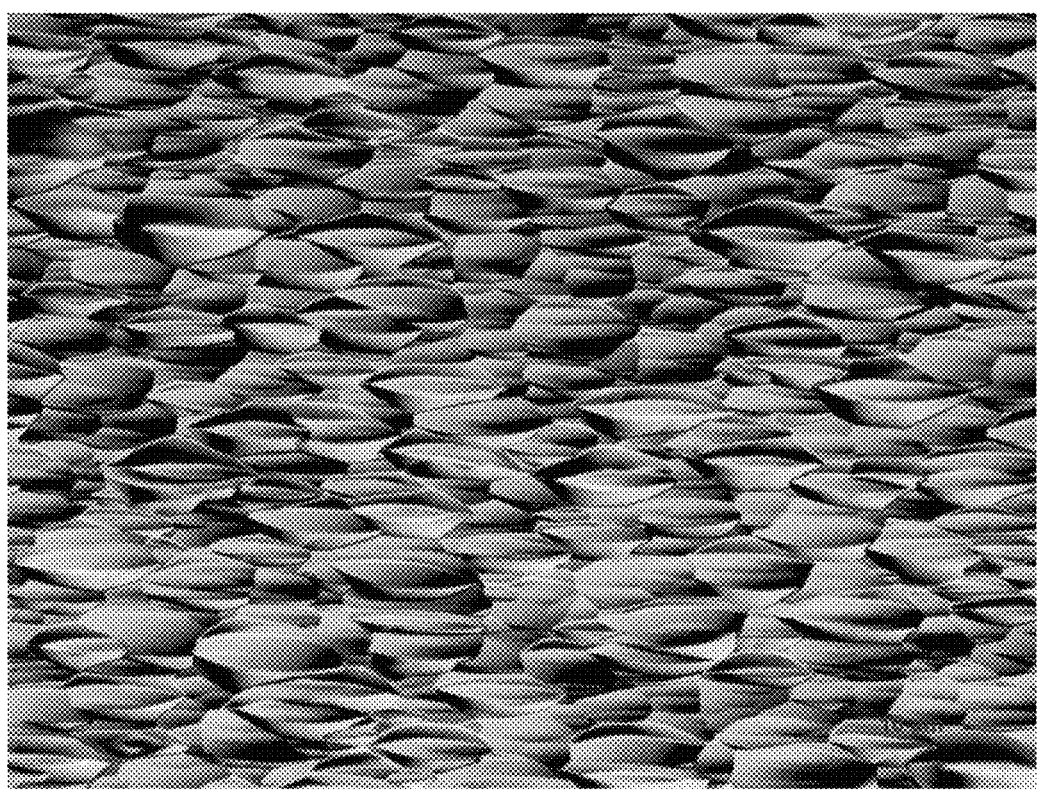
FIG. 2a is an image of the back side surface of {100} indium phosphide (InP) wafer obtained in Example 2 of the present invention observed by optical microscope at 500-fold magnification, showing regular morphology of the pits of olive-shape.
Figure 2B:
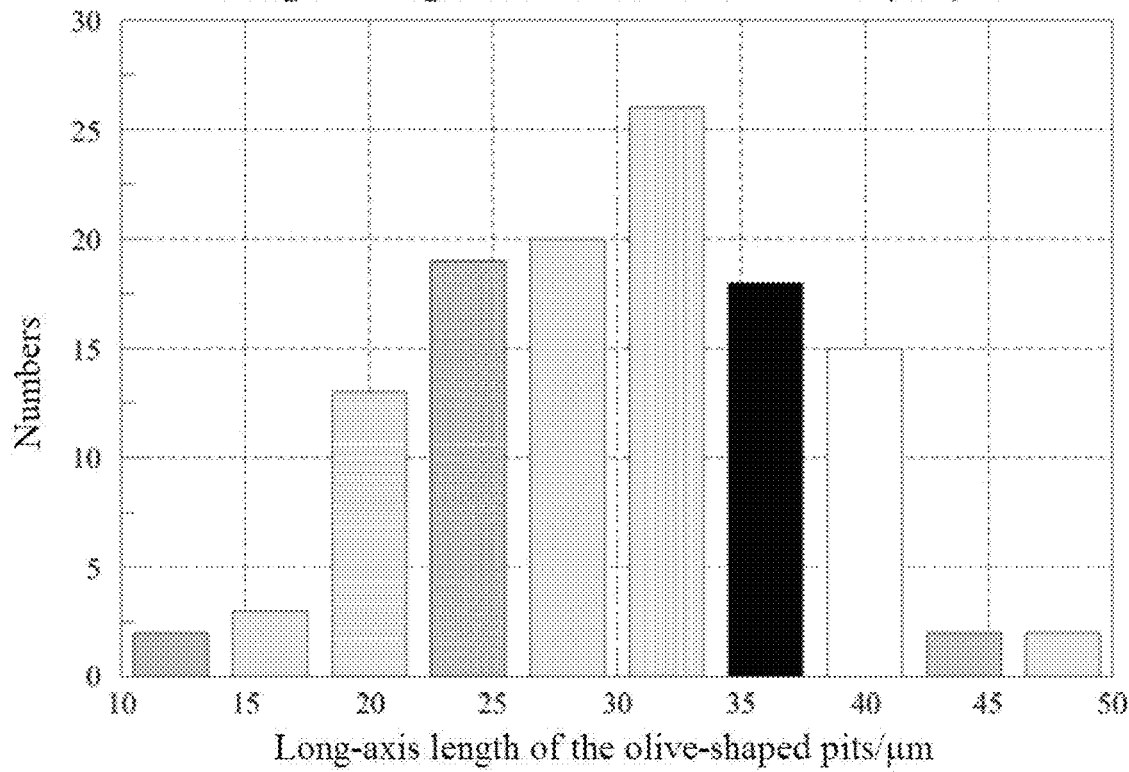
FIG. 2b illustrates a histogram of the long-axis length distribution of the pits of olive-shape on the back side surface of the {100} indium phosphide (InP) wafer obtained in Example 2 of the present invention.
Figure 2C:
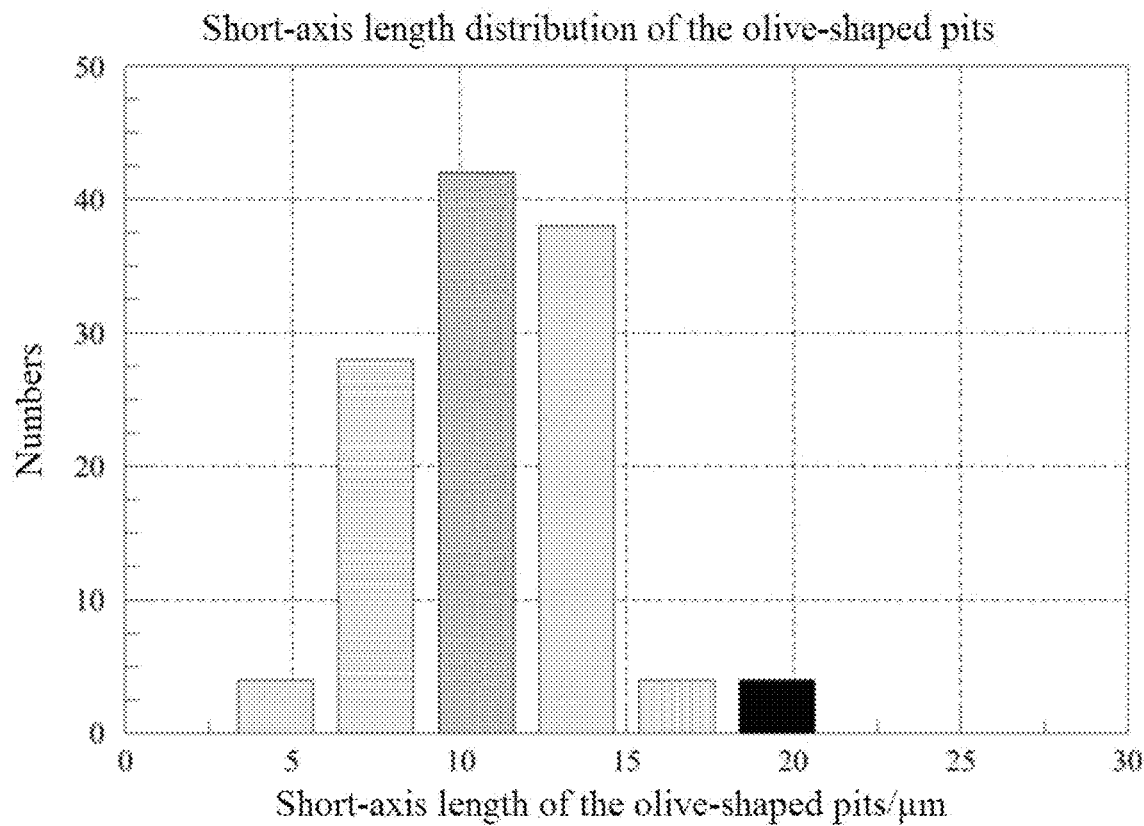
FIG. 2c illustrates a histogram of the short-axis length distribution of the pits of olive-shape on the back side surface of the {100} indium phosphide (InP) wafer obtained in Example 2 of the present invention.
Figure 2D:
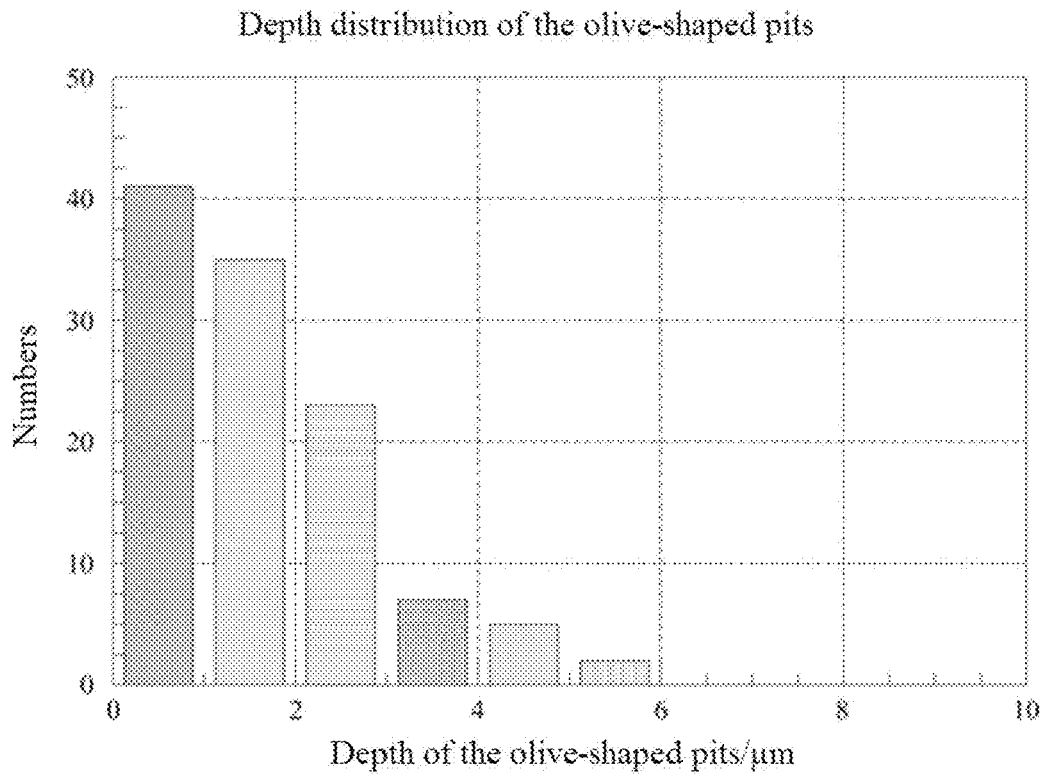
FIG. 2d illustrates a histogram of depth distribution of the pits of olive-shape on the back side surface of the {100} indium phosphide (InP) wafer obtained in Example 2 of the present invention.

A {100} indium phosphide (InP) wafer was manufactured by a method comprising the following steps, wherein the above etching solution is used:

(1) Cutting a {100} indium phosphide indium (InP) wafer from an indium phosphide ingot with a multi-wire cutting machine, wherein the indium phosphide ingot is a monocrystalline indium phosphide ingot having a circular transverse cross-section (referred to as circular indium phosphide ingot) and a square longitudinal cross-section, the circular transverse cross-section has a diameter of 10 cm;

(1') Subjecting the cut wafer in the step (1) to edge-chamfering treatment using a chamfering machine to produce an arc-shaped edges (FIG. 4a);

(1") Subjecting both sides of the {100} indium phosphide (InP) wafer to surface lapping, the lapping compound used for surface lapping is commercially available alumina powder having a median particle size of 9 to 12 μm;

(2) Immersing the {100} indium phosphide (InP) wafer into the above mentioned etching solution at 60° C. for 480 s;

(3) Removing the etched {100} indium phosphide (InP) wafer and washing it with deionized water;

(4) Protecting the back side surface of the etched {100} indium phosphide (InP) wafer;

(5) Subjecting the etched {100} indium phosphide (InP) wafer that has back side surface been protected to mechanical polishing and chemical polishing; of the front side surface and then washing it with deionized water;

(6) De-protecting the back side of the {100} indium phosphide (InP) wafer to give a {100} indium phosphide (InP) wafer having pits of olive-shape distributed on the back side, further washing and drying the wafer and then observing the surface morphology thereof with optical microscope (BX53, available from OLYMPUS Corporation) (observation position being the center of the circular wafer). FIG. 2a shows the surface morphology of the wafer, wherein the long axis is parallel to [011] and the short axis is parallel to [0-11] (the included angles between long axes or between short axes are less than 5°). FIG. 2b shows the histogram of the long-axis length distribution of the pits of olive-shape on the resulting {100} indium phosphide (InP) wafer; and FIG. 2c shows the histogram of the short-axis length distribution.

The resulting wafer has a thickness of 500 μm, a back side surface roughness Ra of 1.0 μm. The pits of olive-shape have a long-axis length of 12 to 40 μm and an average short-axis length of 5 to 20 μm. The pits of olive-shape on the back side of the resulting wafer have a maximum depth of 5.0 μm, and the percentage of the pits of olive-shape having a depth of more than 2.0 μm is 30%.

The wafers as measured under the above items 1, 2.2 and 3 are acceptable.

Example 3

An etching solution comprising phosphoric acid, deionized water and potassium dichromate solution was formulated. Based on mole ratio, $H_3PO_4$, $K_2Cr_2O_7$ and deionized water present in the etching solution are in a ratio of 1:0.04:1.8.

A {100} indium phosphide (InP) wafer was manufactured by a method comprising the following steps, wherein the above etching solution is used:

(1) Cutting a {100} indium phosphide indium (InP) wafer from an indium phosphide ingot with a multi-wire cutting machine, wherein the indium phosphide ingot is a monocrystalline indium phosphide ingot having a circular transverse cross-section (referred to as circular indium phosphide ingot) and a square longitudinal cross-section, the circular transverse cross-section has a diameter of 10 cm;

(1') Subjecting the cut wafer in the step (1) to edge-chamfering treatment using a chamfering machine to produce an arc-shaped edges (FIG. 4a);

(1") Subjecting both sides of the {100} indium phosphide (InP) wafer to surface lapping, the lapping compound used for surface lapping is commercially available alumina powder having a median particle size of 6 to 8 μm;

(2) Immersing the {100} indium phosphide (InP) wafer into the above mentioned etching solution at 60° C. for 150 s;

(3) Removing the etched {100} indium phosphide (InP) wafer and washing it with deionized water;

(4) Protecting the back side surface of the {100} indium phosphide (InP) wafer;

(5) Subjecting the etched {100} indium phosphide (InP) wafer that has been protected on the back side surface to mechanical polishing and chemical polishing; and then washing it with deionized water.

Figure 3A:
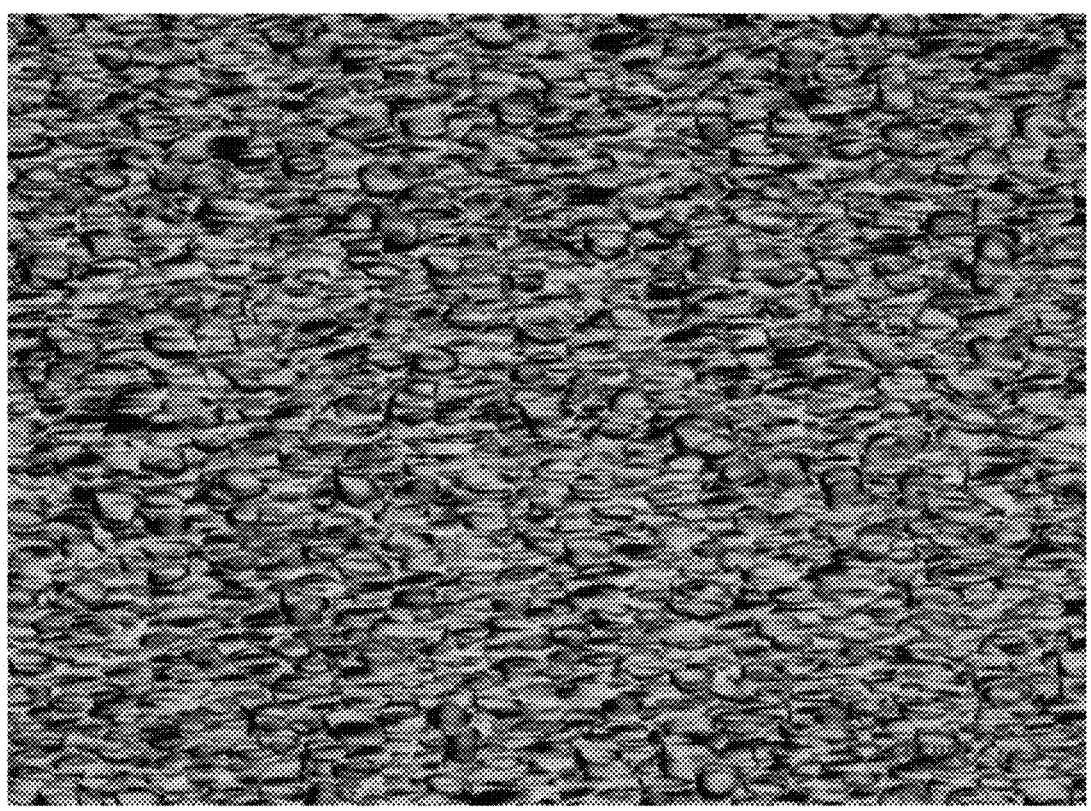
FIG. 3a is an image of the back side surface of {100} indium phosphide (InP) wafer obtained in Example 3 of the present invention observed by optical microscope at 500-fold magnification, wherein the pits of olive-shape show irregular morphology as compared with those of Examples 1 and 2.
Figure 3B:
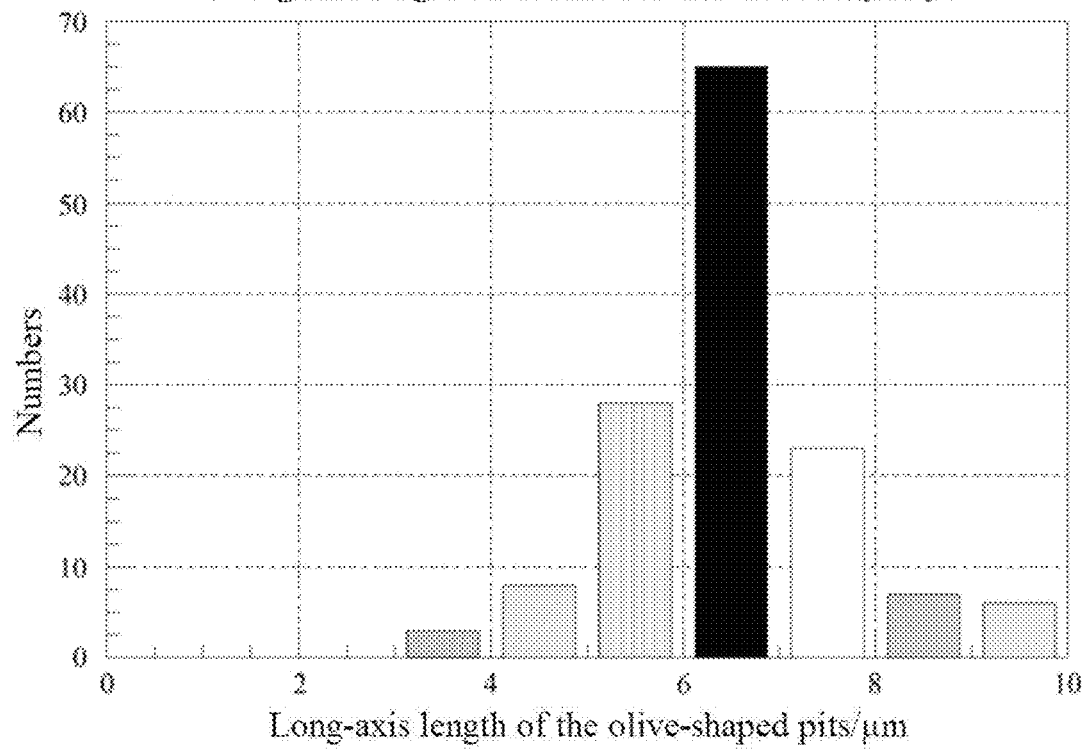
FIG. 3b illustrates a histogram of the long-axis length distribution of the pits of olive-shape on the back side surface of the {100} indium phosphide (InP) wafer obtained in Example 3 of the present invention.
Figure 3C:
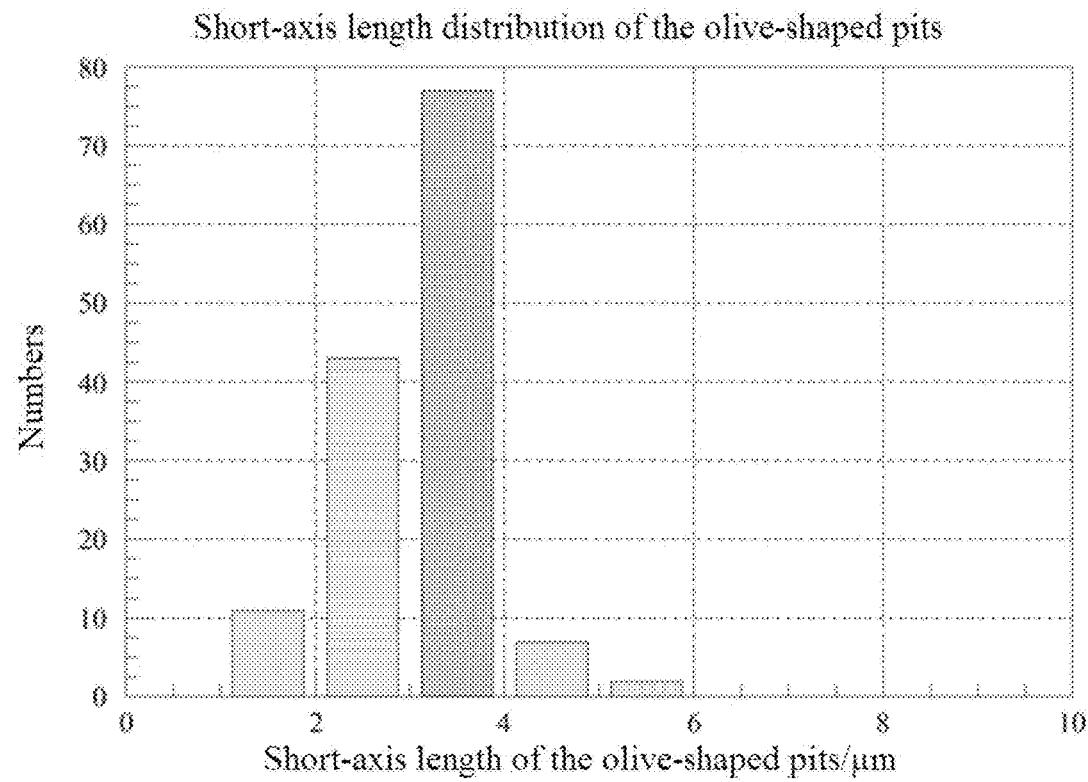
FIG. 3c illustrates a histogram of the short-axis length distribution of the pits of olive-shape on the back side surface of the {100} indium phosphide (InP) wafer obtained in Example 3 of the present invention.
Figure 3D:
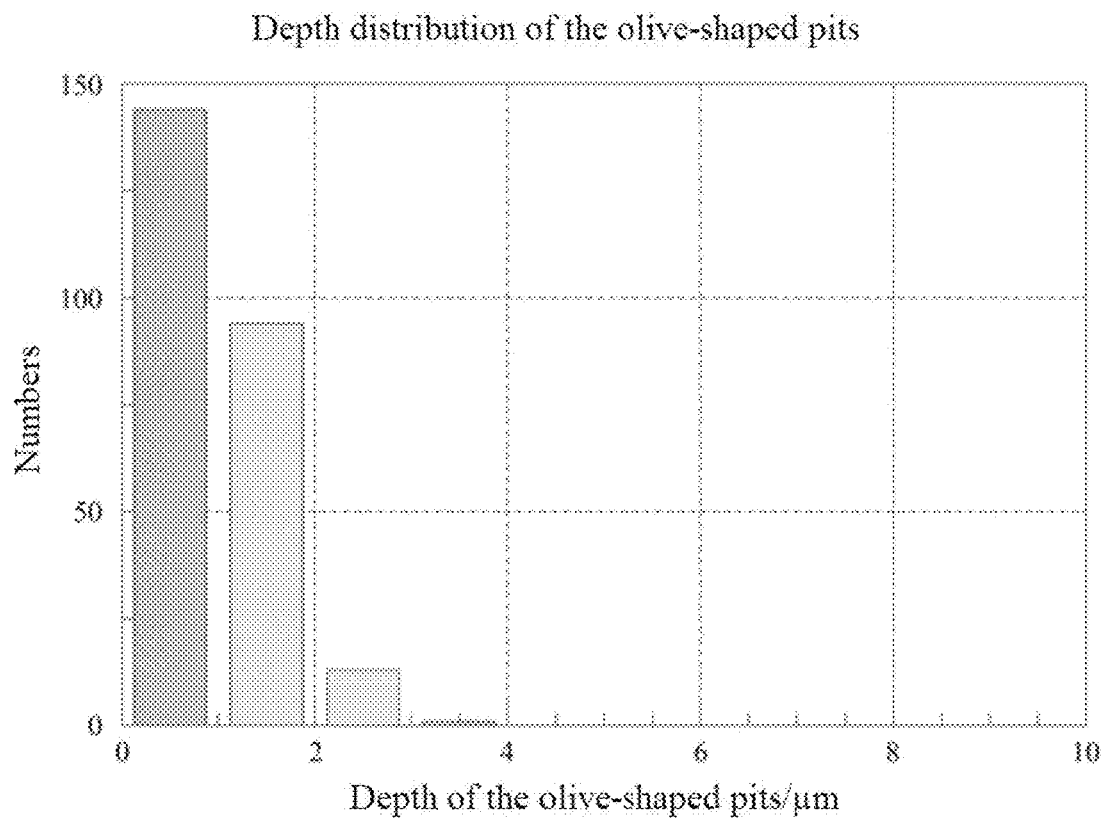
FIG. 3d illustrates a histogram of depth distribution of the pits of olive-shape on the back side surface of the {100} indium phosphide (InP) wafer obtained in Example 3 of the present invention.

(6) De-protecting the back side of the {100} indium phosphide (InP) wafer to give a {100} indium phosphide (InP) wafer having pits of olive-shape distributed on the back side surface, further, washing and drying the wafer, and then observing the surface morphology thereof with optical microscope (BX53, available from OLYMPUS Corporation) (observation position being the center of the circular wafer). FIG. 3a shows the surface morphology of the wafer. FIG. 3b shows the histogram of the long-axis length distribution of the pits of olive-shape on the back side of the resulting {100} indium phosphide (InP) wafer; and FIG. 3c shows the histogram of the short-axis length distribution.

The resulting wafer has a thickness of 550 µm, a back side surface roughness Ra of 0.6 µm. The pits of olive-shape have a long-axis length of 3 to 11 µm and an average short-axis length of 1 to 7 µm. The pits of olive-shape on the back side of the resulting wafer have a maximum depth of 3.5 µm, and the percentage of the pits of olive-shape having a depth of more than 1.0 µm is 33%.

The wafers as measured under the above items 1, 2.2 and 3 are acceptable.

Application Example

The epi-ready wafer obtained in Example 1 was used directly as substrate for epitaxial growth of indium gallium arsenide (InGaAs) epitaxial layer on the front surface to test the present invention on epitaxial layer performance.

In order to illustrate the influence of the product of the present invention on epitaxial layer performance, the photoluminescence uniformity of the epitaxial layer grown on the substrate obtained in Example 1—the {100} indium phosphide (InP) wafer having pits of olive-shape distributed on the back side surface is compared with epitaxial layer grown on other indium phosphide (InP) wafers without pits of olive-shape on the back side surface. A metal-organic chemical vapor deposition (MOCVD) reactor is used as the epitaxial growth apparatus. The epitaxial growth structure consists of initially growing an indium phosphide buffer layer with a thickness of 1 µm on the indium phosphide substrate, and then growing an indium gallium arsenide (InGaAs) epitaxial layer with a thickness of 2 µm on the buffer layer, the growth temperature being 645° C. and the growth pressure being 40 mbar. Photoluminescence spectrometer having an excitation wavelength of 532 nm was used to measure the uniformity of the wavelength and luminance of the epitaxial wafers.

Figure 5A:
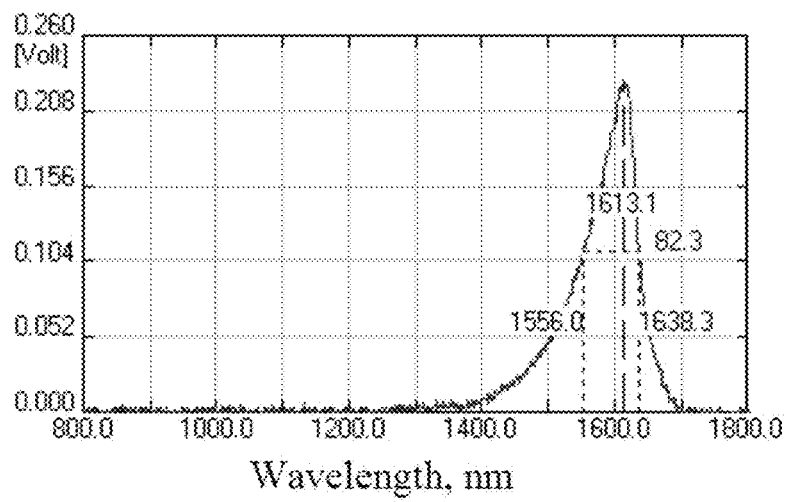
FIG. 5a is a measurement result of the photoluminescence (abbreviated as PL) spectra over the wavelength range from 800 nm to 1800 nm at a single point in the center of an indium-gallium-arsenide epitaxial layer grown on the {100}indium phosphide (InP) substrate having pits of olive-shape on the back side surface obtained in Using Example 1 of the present invention.

FIG. 5a shows a full-wavelength PL (photoluminescence) spectrum of an InGaAs measured at a single point of the epitaxial layer on the {100} indium phosphide substrate obtained in the Using Example 1 of the present invention. The peak wavelength of the PL (photoluminescence) spectrum measured at the central point of the epitaxial layer is 1613.1 nm; said peak has a narrow width and a high peak, showing good performance of the substrate.

Figure 5B:
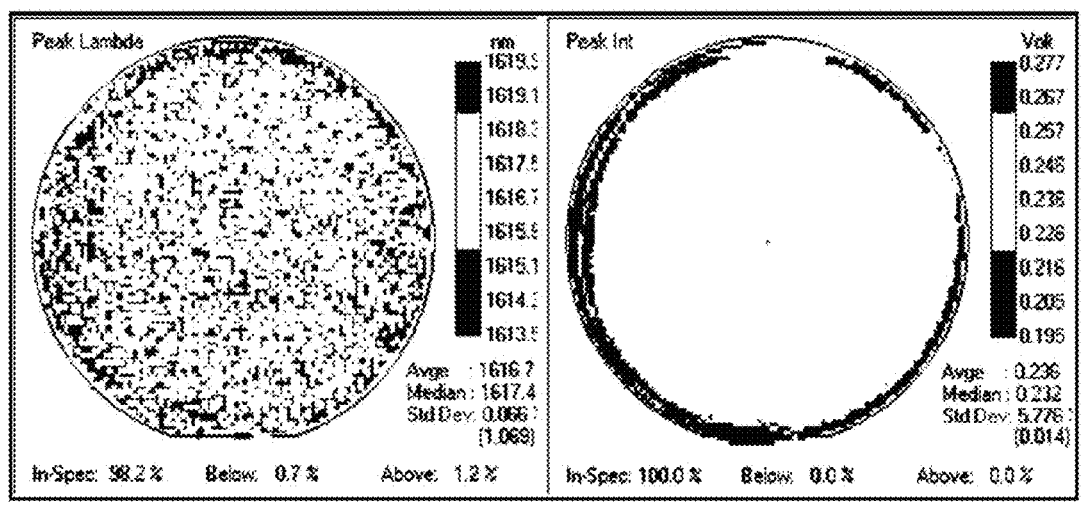
FIGS. 5b and 5c are respectively PL intensity maps showing the uniformity of the peak wavelength and luminescence intensity of the indium-gallium-arsenide epitaxial layer across the entire wafer on the {100} indium phosphide (InP) substrate having pits of olive-shape on the back side surface obtained in Example 1 of the present invention and on the substrate with irregular backside surface morphology as a control.
Figure 5C:
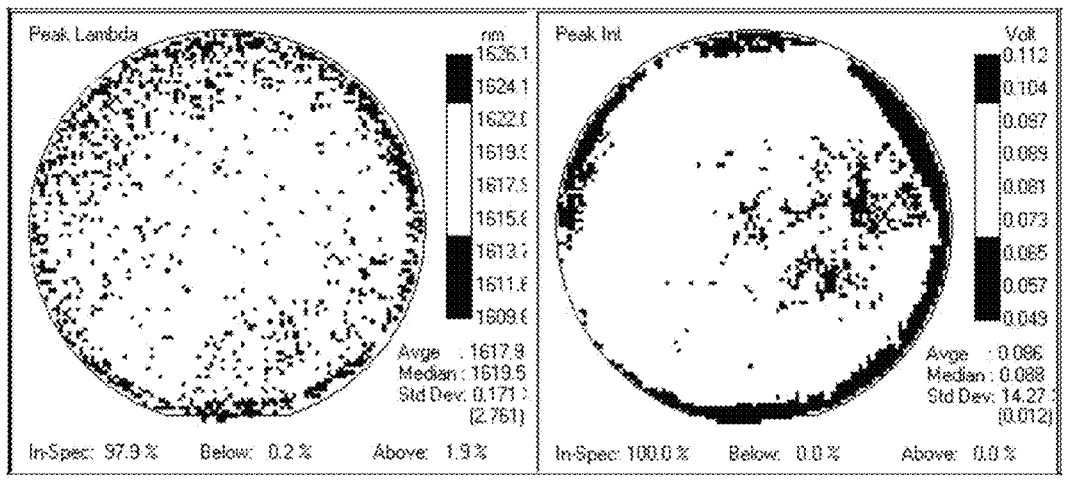

FIGS. 5b and 5c show comparisons of the uniformity of the peak wavelength and luminescence intensity distributions of the indium-gallium-arsenide epitaxial layer grow on the {100} indium phosphide (InP) substrate with pits of olive-shape on the back side surface obtained in Example 1 of the present invention and on the {100} indium phosphide substrate without pits of olive-shape (the products were obtained by the method analogous to Example 1 except that the etching step is omitted).

From the measurement results, it can be seen that the epitaxial layer on the {100} indium phosphide substrate with pits of olive-shape on the back side surface has more uniform wavelength and luminescence intensity distribution and hence has higher quality, as compared with the epitaxial layer on the substrate without pits on the back side surface. Through PL measurements on the epitaxial wafers, it can be found that compared with the indium phosphide (InP) wafer wafers without pits of olive-shape on the back side surface, the {100} indium phosphide (InP) wafer obtained in Application Example 1 during the epitaxial growth allows its back side to absorb heat radiation more uniformly, and thus is advantageous for the uniformity of the growth of the epitaxial layer, thereby enhancing the quality of the epitaxial layer. The surface of the {100} indium phosphide (InP) wafer with pits obtained according to the present invention matches well with the epitaxial conditions.

In addition, the method for manufacturing the {100} indium phosphide (InP) wafer according to the present invention is easy to operate; the indium phosphide wafer has a surface morphology that is easy to control and has good reproducibility.

Although the invention has been described with reference to certain embodiments, persons of ordinary skills in the art will recognize that the embodiments may be modified or equivalently substituted without departing from the spirit and scope of the invention. The scope of the invention is defined by the appended claims.

This application claims priority to Chinese Application No. 201710611710.1, filed on Jul. 25, 2017, the entire disclosure of which is incorporated herein by reference.

The invention claimed is:

1. A {100} indium phosphide wafer comprising:
a wafer having a back side surface; and
olive-shaped pits on the back side surface,
wherein the olive shape is an oval-like shape with first and second ends that are narrow relative to a middle which is relatively wide, and
wherein the pits are regularly distributed on the back side surface such that the pits have oval shapes with acute angles between long axes or between short axes of the pits of not more than 10°.

2. The {100} indium phosphide wafer according to claim 1, wherein
the pits are regularly distributed on the back side surface such that the pits have oval shapes with acute angles between long axes or between short axes of the pits of not more than 6°.

3. The {100} indium phosphide wafer according to claim 1, wherein
the wafer has a first side surface and a second side surface; and
pits on the first side surface or on the first and second sides surfaces.

4. The {100} indium phosphide wafer according to claim 1, wherein
the pits have an average long-axis length of 3 to 50 µm, and
an average short-axis length of 1 to 30 µm.

5. The {100} indium phosphide wafer according to claim 4, wherein
the pits have an average long-axis length of 3 to 45 µm, and
an average short-axis length of 1 to 20 µm.

6. The {100} indium phosphide wafer according to claim 1, wherein
the back side of the wafer has a surface roughness Ra in a range of 0.2 to 1.5 μm.

7. The {100} indium phosphide wafer according to wherein
the back side of the wafer has a surface roughness Ra in a range of 0.5 to 1.0 μm.

8. The {100} indium phosphide wafer according to claim 1, wherein
the pits on the back side of the wafer have a maximum depth of 5.0 μm, and
not less than 30% of the pits have a depth more than 2.0 μm.

9. The {100} indium phosphide wafer according to claim 1, wherein
the pits on the back side of the wafer have a maximum depth of 3.5 μm, and
not less than 20% of the pits have a depth more than 1.5 μm.

10. The {100} indium phosphide wafer according to claim 1, wherein
the pits on the back side of the wafer have a maximum depth of 3.5 μm, and
not less than 30% of the pits have a depth more than 1.0 μm.

11. A method for manufacturing the {100} indium phosphide wafer according to claim 1, wherein the method comprises:
subjecting the indium phosphide wafer to surface lapping on both sides;
etching the indium phosphide wafer by immersing it into etching solutions to produce etch pits;
removing the indium phosphide wafer that has been etched and washing it with deionized water;
protecting the back side surface of the indium phosphide wafer that has been etched;
subjecting the indium phosphide wafer which has had the back side surface etched and protected to mechanical polishing and chemical polishing on the front side surface, and then washing it with deionized water; and
de-protecting the back side surface of the indium phosphide wafer,
wherein the etching solutions comprise an acidic substance, deionized water and an oxidizing agent; the acidic substance, deionized water and oxidizing agent present in the etching solutions are in ratios of 1:(0.02-0.6):(1.5-6), based on mole ratio; the etching temperature has a range from 15 to 95° C., and the etching time is from 10 to 600 s.

12. The method for manufacturing the {100} indium phosphide wafer according to claim 11, wherein in the manufacturing method, the indium phosphide wafer to be subjected to surface lapping is cut from an indium phosphide ingot that has a diameter of 2 to 15 cm.

13. The method for manufacturing the {100} indium phosphide wafer according to claim 11, wherein the protecting is carried out using a protective layer, wherein the protective layer is a plastic sheet, a metal sheet, a glass sheet, or a ceramic sheet, the protective layer is fixed to the wafer with beeswax or Arabic gum; and the protective layer detaches after heating.

14. The method for manufacturing the {100} indium phosphide wafer according to claim 12, wherein the protecting is carried out using a protective layer, wherein the protective layer is a plastic sheet, a metal sheet, a glass sheet, or a ceramic sheet, the protective layer is fixed to the wafer with beeswax or Arabic gum; and the protective layer detaches after heating.

15. An etching solution for manufacturing the {100} indium phosphide wafer according to claim 1, comprising an acidic substance, a deionized water and an oxidizing agent, wherein the acidic substance, deionized water and oxidizing agent present in etching solutions are in the ratios of 1: (0.02 to 0.6):(1.5-6), based on mole ratio.

* * * * *